United States Patent
Furukawa et al.

(10) Patent No.: US 6,333,533 B1
(45) Date of Patent: Dec. 25, 2001

(54) TRENCH STORAGE DRAM CELL WITH VERTICAL THREE-SIDED TRANSFER DEVICE

(75) Inventors: Toshiharu Furukawa, Essex Junction; Mark C. Hakey, Fairfax; Steven J. Holmes, Milton; David V. Horak, Essex Junction, all of VT (US); Thomas S. Kanarsky, Hopewell Junction; Jack A. Mandelman, Stormville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/394,964

(22) Filed: Sep. 10, 1999

(51) Int. Cl.$^7$ .................................................. H01L 27/108
(52) U.S. Cl. ......................... 257/301; 257/296; 257/302; 257/304; 257/305; 257/306; 438/242; 438/243; 438/268; 438/386
(58) Field of Search .................................... 257/301, 302, 257/304, 296, 401, 305; 438/242, 243, 386, 268

(56) References Cited

U.S. PATENT DOCUMENTS

| | | | |
|---|---|---|---|
| 5,831,301 | * | 11/1998 | Horak et al. .......................... 257/302 |
| 6,037,194 | * | 3/2000 | Bronner et al. ....................... 438/147 |
| 6,184,549 | * | 2/2001 | Furukawa et al. ................... 257/302 |

FOREIGN PATENT DOCUMENTS

| | | | |
|---|---|---|---|
| 2-62070-A | * | 3/1990 | (JP) . |
| 4-61273-A | * | 2/1992 | (JP) . |

* cited by examiner

Primary Examiner—Tom Thomas
Assistant Examiner—Donghee Kang
(74) Attorney, Agent, or Firm—Ratner & Prestia; Eugene I. Shkurko, Esq.

(57) ABSTRACT

A pair of dynamic random access memory cells having each end of the active area surrounded on three sides by a gate conductor. The width of each end of the active area that is surrounded by a gate conductor preferably is less than fifty percent of the width of the deep trench intersected by that end of the active area.

20 Claims, 13 Drawing Sheets

TRENCH STORAGE DRAM CELL WITH VERTICAL THREE-SIDED TRANSFER DEVICE

BACKGROUND OF THE INVENTION

1. Field of the Invention

The present invention generally relates to integrated circuit dynamic random access memories (DRAM's) and, more particularly, to trench capacitor construction.

2. Background Description

As dynamic random access memory cells are scaled down (e.g., to dimensions of 0.15μ and below) to meet chip-size requirements for future generations, planar (i.e., horizontally disposed) devices can no longer be used as transfer devices. Such use is precluded because of the high channel doping necessary to meet the off-current requirement which leads to high junction leakage and poor retention time, particularly with a trench storage DRAM cell using a buried strap. Vertical transfer devices have been proposed to overcome the problem.

Vertical transfer devices generate, however, a new set of problems. For example, back-to-back device interference is created. In addition, the depth of the storage trenches and the shallow trench isolation must increase to accommodate a long channel of the vertical transfer. This increased depth complicates the fabrication process and adds to the cost of the product. Another problem is increased substrate sensitivity due to high doping required to minimize back-to-back interference. Furthermore, the long channel required for improved threshold voltage tolerance due to channel length variations due to the manufacturing process results in a penalty in the on-current. Yet another problem is variable channel surface geometry and gate oxide thickness because of the overlay variations between the silicon of the vertical metal oxide semiconductor field effect transistor (MOSFET) and storage trench regions.

To overcome the problems of conventional vertical DRAM cells, a new trench storage DRAM cell is provided having a vertical three-sided transfer device. It is an object of the present invention to provide a new and improved vertical transfer device that is built on top of a deep trench storage node and is compatible with contemporary DRAM process steps. It is another object of the present invention to provide dynamic random access memory cells that have increased on-current of the vertical MOSFETs. It is a further object of the present invention to provide dynamic random access memory cells that have channel regions of increased length in the active area which improves the threshold voltage tolerance. Still another object of the present invention is to provide dynamic random access memory cells that have flexibility in setting the length of the channel regions in the active area. Yet another object of the present invention is to provide dynamic random access memory cells which, because of the shapes and sizes of the trenches and the active area, reduce the risk associated with misalignment of the trenches and active area which can lead to variations in electrical characteristics.

SUMMARY OF THE INVENTION

To achieve these and other objects, and in view of its purposes, the present invention provides a pair of dynamic random access memory cells. As constructed in accordance with the present invention, the pair of DRAM cells includes a substrate having first and second deep trenches separated by an active area defined by a first end at a sidewall of the first deep trench and a second end at a sidewall of the second deep trench. The pair of DRAM cells also includes a first diffusion region (1) in the active area, (2) extending between an upper portion of the first deep trench and an upper portion of the second deep trench, and (3) connected to a bitline. The pair of DRAM cells further includes a second diffusion region in the active area and adjacent the sidewall of the first deep trench, whereby a first channel region is created in the active area between the first diffusion region and the second diffusion region, and a third diffusion region in the active area and adjacent the sidewall of the second deep trench, whereby a second channel region is created in the active area between the first diffusion region and the third diffusion region.

The pair of dynamic random access memory cells, constructed in accordance with the present invention, further includes first and second storage node electrodes in lower portions of the first deep trench and the second deep trench, respectively; first and second storage plates surrounding lower portions of the first deep trench and the second deep trench, respectively; and first and second dielectric members, respectively, between the first storage node electrode and the first storage plate and between the second storage node electrode and the second storage plate. The pair of dynamic random access memory cells, constructed in accordance with the present invention, also includes a first gate conductor (a) in the upper portion of the first deep trench, (b) surrounding the first end of the active area in the substrate, and (c) connected to a first wordline for controlling current in the first channel region between the first diffusion region and the second diffusion region. A second gate conductor is provided (a) in the upper portion of the second deep trench, (b) surrounding the second end of the active area in the substrate, and (c) connected to a second wordline for controlling current in the second channel region between the first diffusion region and the third diffusion region. Also included in the pair of dynamic random access memory cells, constructed in accordance with the present invention, are a first isolation collar on the walls of the upper portion of the first deep trench extending between the first storage plate and the second diffusion region, a second isolation collar on the walls of the upper portion of the second deep trench extending between the second storage plate and the third diffusion region, and first and second buried straps, respectively, connecting the first storage node electrode with the second diffusion region and the second storage node electrode with the third diffusion region.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figures 1, 1A:
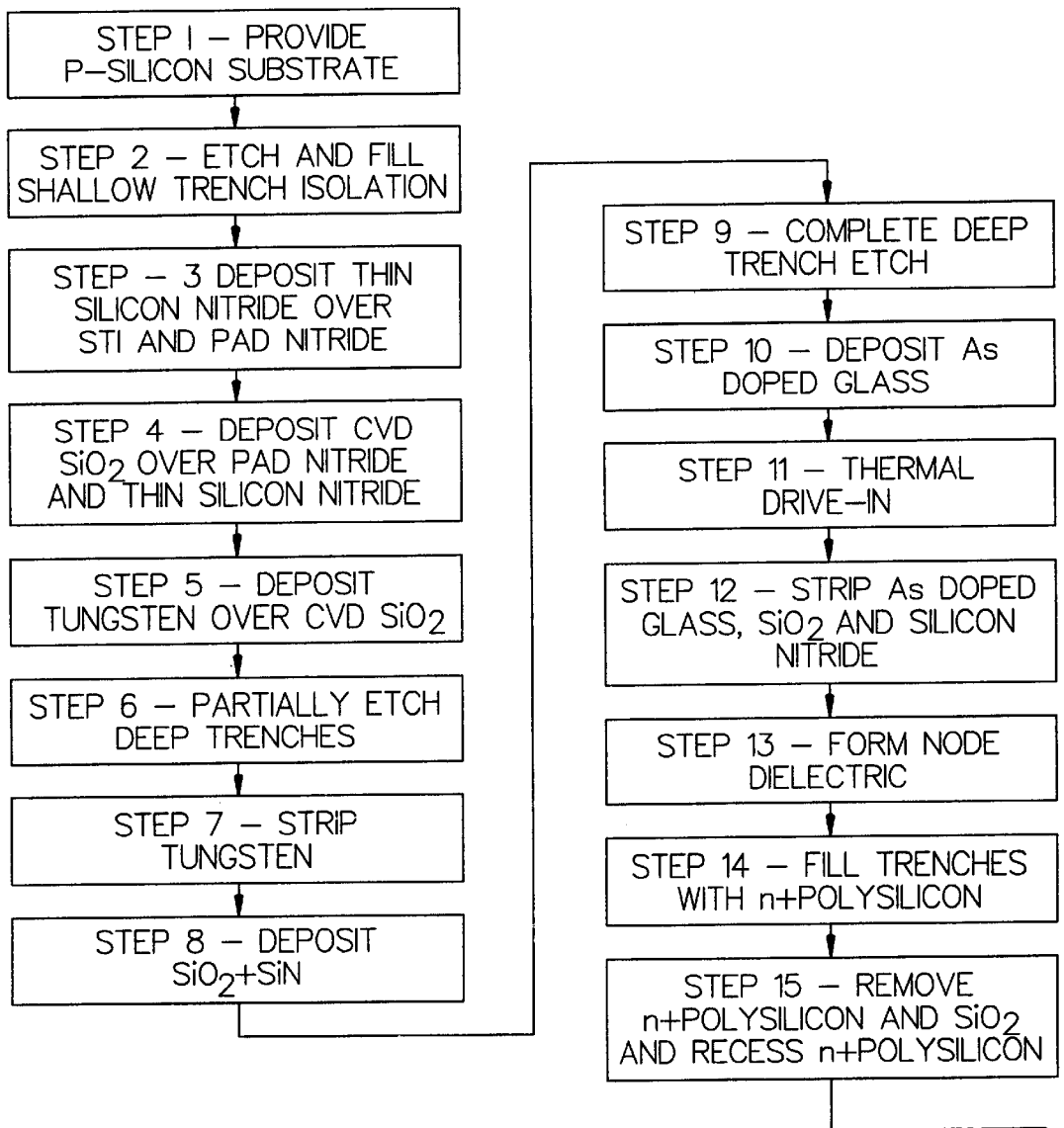
FIG. 1 is a flow chart of the process of making a pair of dynamic random access memory cells in accordance with the present invention.
Figure 1B:
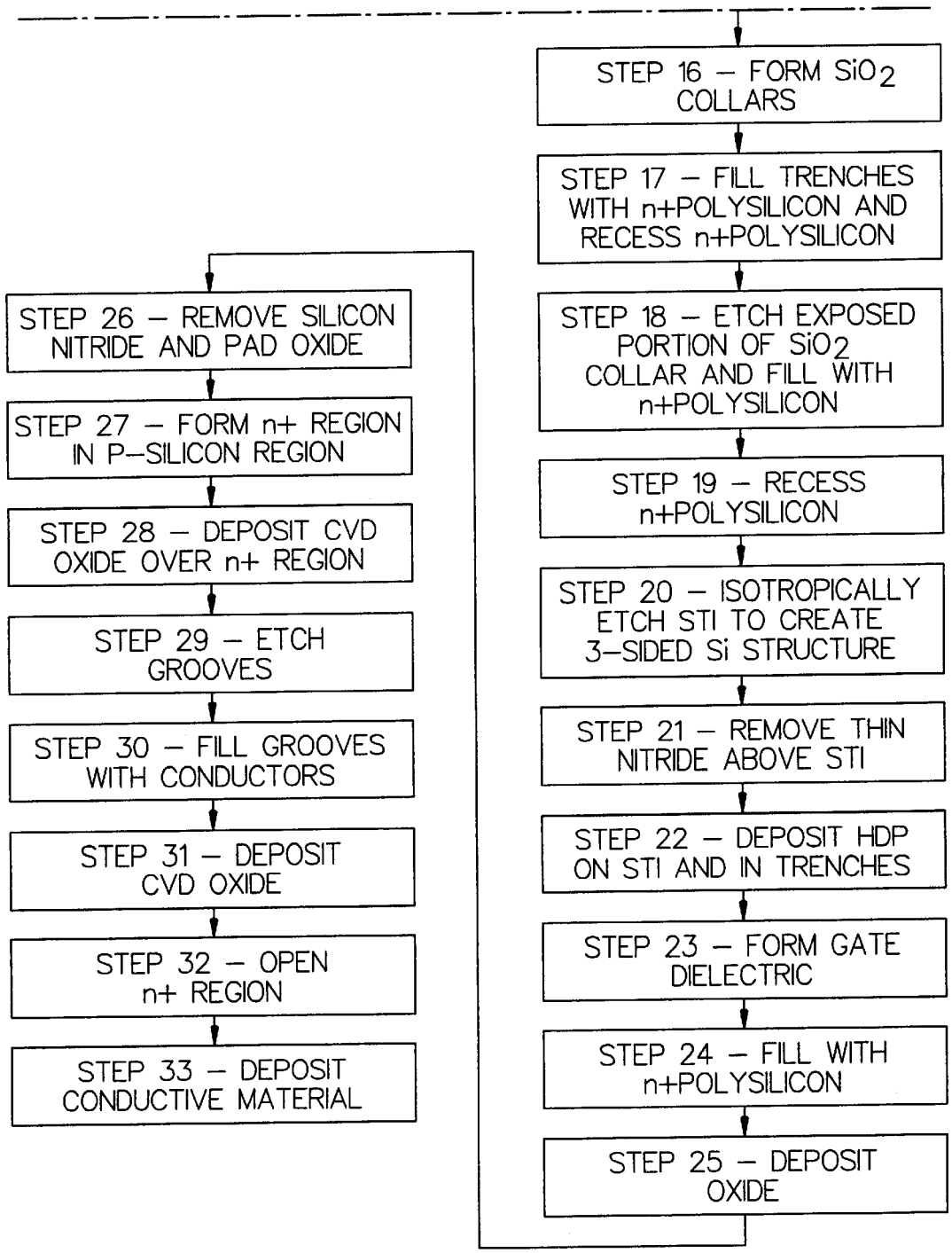
Figure 2:
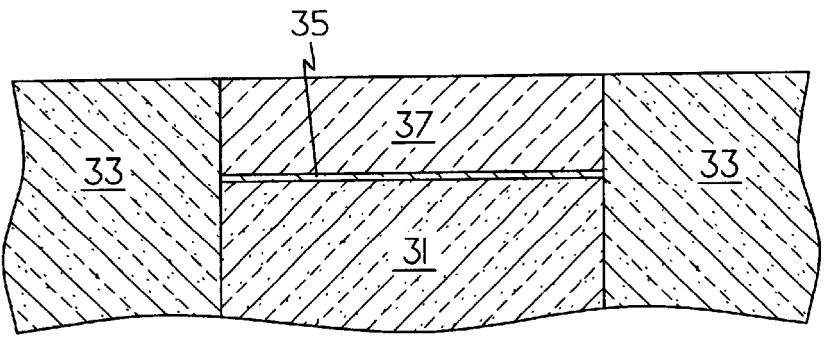
FIG. 2 is a cross-section view of the structure as it would appear after STEP 2 of the process of FIG. 1.

Referring to FIG. 1, STEP 1 in the process of the present invention for making a dynamic random access memory cell is to provide a p-type silicon substrate 31. P-type silicon substrate 31 typically will be comprised of 1–2 Ω-cm boron doped <100> silicon on which a pad oxide layer 35 is grown with a pad nitride layer 37 deposited over the pad oxide layer 35. In STEP 2, trenches for shallow trench isolation (STI) are etched and filled with $SiO_2$. The $SiO_2$ is planarized to the top of the pad nitride layer 37. Referring to FIG. 2, which shows how the structure would appear after STEP 2 of the process of FIG. 1, p-silicon substrate 31 has shallow trench isolation regions 33 with pad oxide layer 35 and pad nitride layer 37 extending between the shallow trench isolation regions 33.

Figure 3:
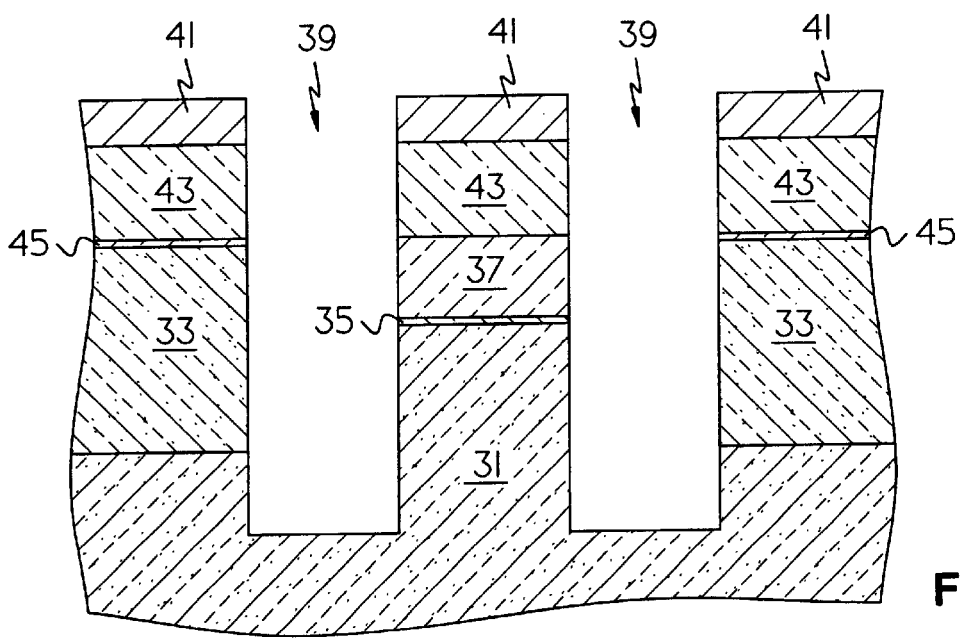
FIG. 3 is a cross-section view of the structure as it would appear after STEP 6 of the process of FIG. 1.

Returning to FIG. 1, in STEP 3, a thin layer of silicon nitride 45 is deposited over the shallow trench isolation regions 33 and the pad nitride layer 37. In STEP 4, a $SiO_2$ layer 43 is deposited, using chemical vapor deposition (CVD), over the pad nitride layer 37 and silicon nitride layer 45. CVD is a process for depositing a thin film of material onto a substrate by reacting the constituent elements in gaseous phase. CVD processes are used to produce thin, single-crystal films called epitaxial films. In STEP 5, a CVD tungsten layer 41 is deposited over the CVD $SiO_2$ layer 43. Then, in STEP 6, deep trenches 39 are partially etched to a depth that extends below the shallow trench isolation regions 33. Referring to FIG. 3, which shows the structure after STEP 6 of the process of FIG. 1, the upper portions of deep trenches 39 extend through CVD tungsten layer 41, CVD $SiO_2$ layer 43, silicon nitride layer 45, pad nitride layer 37, pad oxide layer 35, and shallow trench isolation regions 33.

Figure 4:
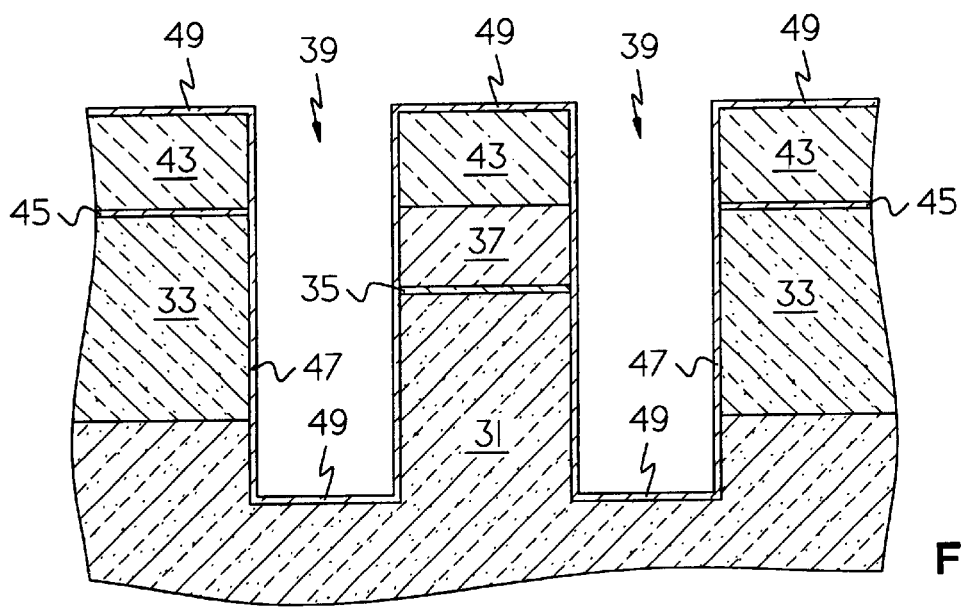
FIG. 4 is a cross-section view of the structure as it would appear after STEP 8 of the process of FIG. 1.

Returning to FIG. 1, in STEP 7, the CVD tungsten layer 41 is stripped and, in STEP 8, layers of CVD $SiO_2$ and silicon nitride are deposited on all surfaces, including the top of the structure and the sidewalls of the deep trenches 39. The layers of CVD $SiO_2$ and silicon nitride will act as an arsenic diffusion mask and also as a mask for arsenic doped glass strip. Referring to FIG. 4, which shows the structure after STEP 8 of the process of FIG. 1, the layers 47 of CVD $SiO_2$ and silicon nitride are applied to deep trenches 39 and the layers 49 of CVD $SiO_2$ and silicon nitride are also applied to the top and trench bottom surface of the structure.

Returning to FIG. 1, the deep trench etching is completed to the full depth of the deep trench 39 in STEP 9. The horizontal portions of the of the CVD $SiO_2$ and silicon nitride layers 49 at the top of the structure and at the bottom of the deep trenches are etched with the CVD $SiO_2$ and silicon nitride layers 47 remaining on the sidewalls of the deep trenches 39. Then, the bottoms of the deep trenches 39 are further etched to expose additional sidewall surfaces of the deep trenches 39. In STEP 10, arsenic doped glass 51 is deposited on the deep trench sidewalls and, in STEP 11, the arsenic doped glass 51 is diffused into the p-silicon substrate 31, by a thermal drive-in, through the sidewalls of the deep trenches 39 that are not lined with CVD $SiO_2$ and silicon nitride layers 47. This step forms n+ buried plates 53.

Figure 5:
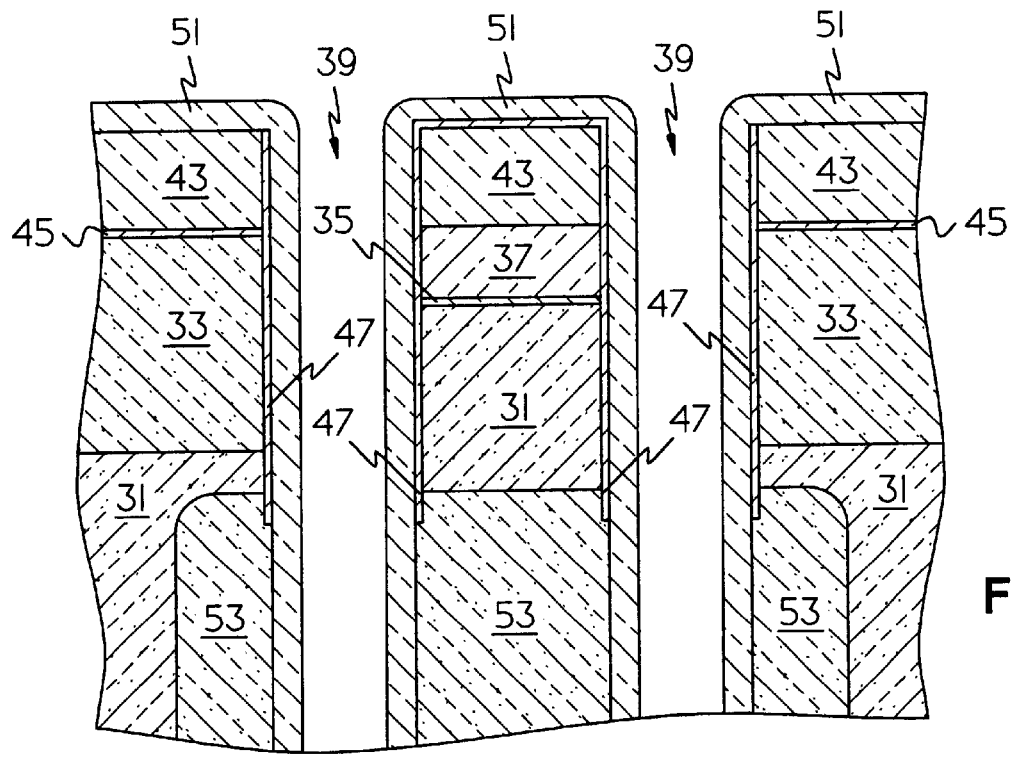
FIG. 5 is a cross-section view of the structure as it would appear after STEP 11 of the process of FIG. 1.

Referring to FIG. 5, which shows the structure after STEP 11 of FIG. 1, arsenic doped glass 51 has been deposited over CVD $SiO_2$ layer 43 and layers 47 of CVD $SiO_2$ and silicon nitride on the sidewalls of deep trenches 39. The arsenic doped glass 51 extends to below the ends of layers 47 of CVD $SiO_2$ and silicon nitride on the sidewalls of deep trenches 39. By a thermal drive-in, the arsenic diffuses through the unprotected sidewalls of deep trenches 39 to form n+ buried plates 53.

Returning to FIG. 1, in STEP 12, the arsenic doped glass 51, CVD $SiO_2$ layer 43 at the top of the structure, and the layers 47 of CVD $SiO_2$ and silicon nitride on the sidewalls of deep trenches 39 are stripped. Then, in STEP 13, nitride-oxide node dielectrics 55 are formed on the sidewalls of the deep trenches and, in STEP 14, the deep trenches 39 are filled with n+ and intrinsic multi-layer polysilicon 57. Next, in STEP 15, the n+ polysilicon 57 is planarized to remove the n+ polysilicon 57 from above the CVD $SiO_2$ layer 43 and the CVD $SiO_2$ layer 43 is removed and the n+ polysilicon 57 then is etched to a level below the n+ buried plates 53.

Then, in STEP 16, a layer of $SiO_2$ is deposited on all surfaces of the deep trenches 39 and the layer of $SiO_2$ at the bottom of each deep trench 39 is etched to form an $SiO_2$ collar 59 in each deep trench 39. In STEP 17, the deep trenches 39 again are filled with n+ polysilicon 57, planarized, and recessed to the desired depth. This n+ polysilicon 57, which is doped, is the source for the n+ diffusion regions 60 at the sidewalls of the deep trenches 39.

This diffusion is gradual and takes place when the structure is exposed to heat. The distance between the top silicon surface and second recesses in the deep trenches 39 is set by the channel length requirement of the vertical MOSFET. Typically, the range is between 0.1 and 1.0 μm. These n+ diffusion regions 60 will serve as either the sources or the drains of the transfer devices.

Figure 6:
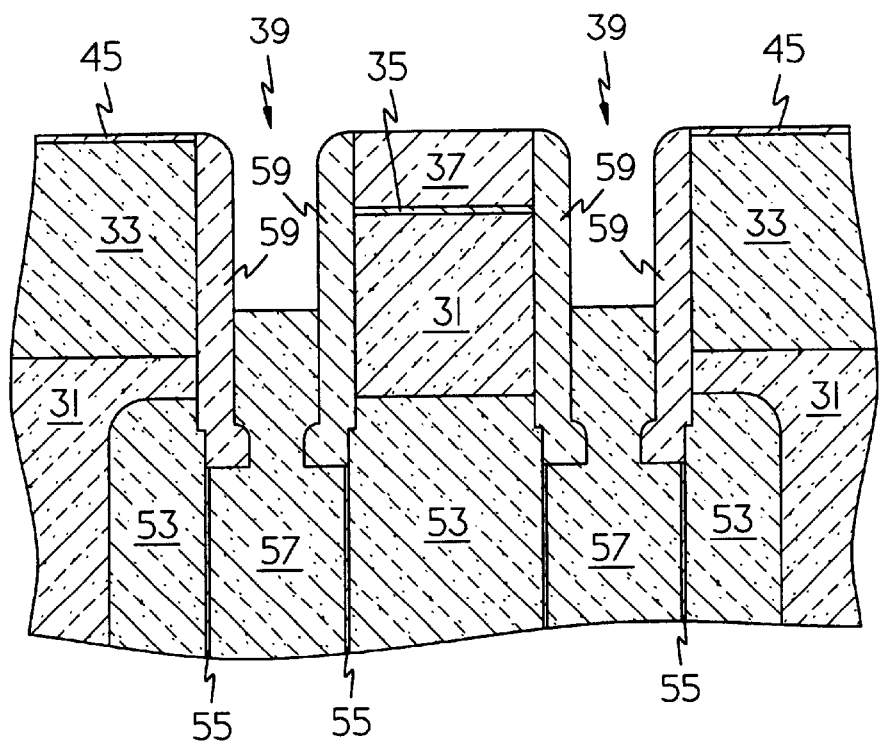
FIG. 6 is a cross-section view of the structure as it would appear after STEP 17 of the process of FIG. 1.

Referring to FIG. 6, which shows the structure after STEP 17 of the process of FIG. 1, the arsenic doped glass 51 has been stripped and node dielectrics 55 have been formed on the lower portions of the sidewalls of deep trenches 39. The lower portions of deep trenches 39 have been filled with n+ polysilicon 57 which functions as storage node electrodes and the silicon dioxide collar 59 has been formed in the upper portions of the deep trenches 39.

Figure 7:
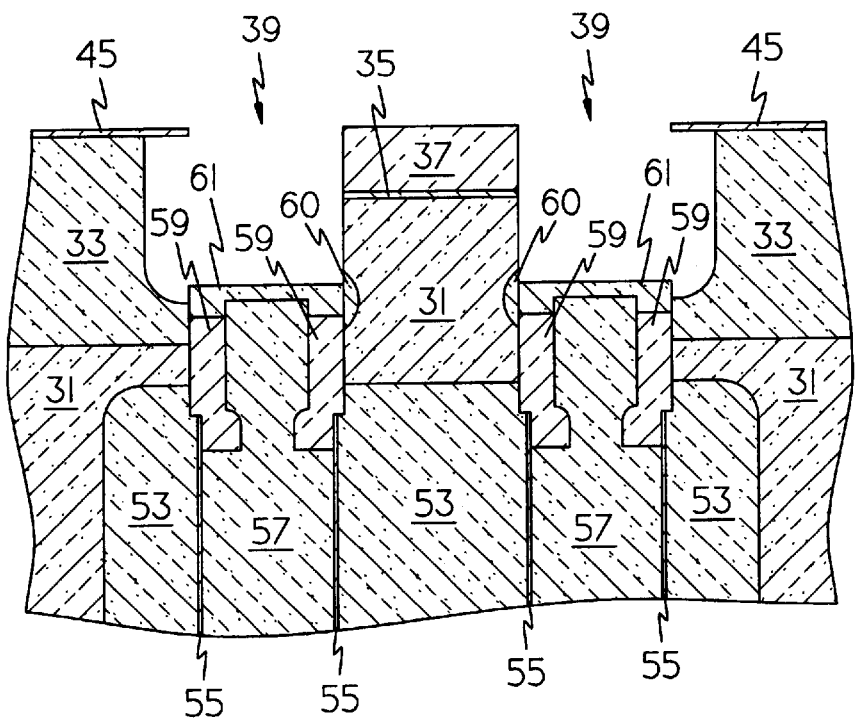
FIG. 7 is a cross-section view of the structure as it would appear after STEP 20 of the process of FIG. 1.

Returning to FIG. 1, in STEP 18, the exposed silicon dioxide collar 59 is etched and the deep trenches 39 once again are filled with n+ polysilicon 57 which is recessed in STEP 19 to leave a conductive cap 61 over the remaining silicon dioxide collar 59. In STEP 20, a portion of the STI regions 33 is isotropically etched to create a three-sided silicon structure. Referring to FIG. 7, which shows the structure after STEP 20 of the process of FIG. 1, an n+ polysilicon conductive cap 61 has been formed over each $SiO_2$ collar 59 and portions of STI regions 33 have been etched. The n+ diffusion regions 60 begin to form.

Figure 8:
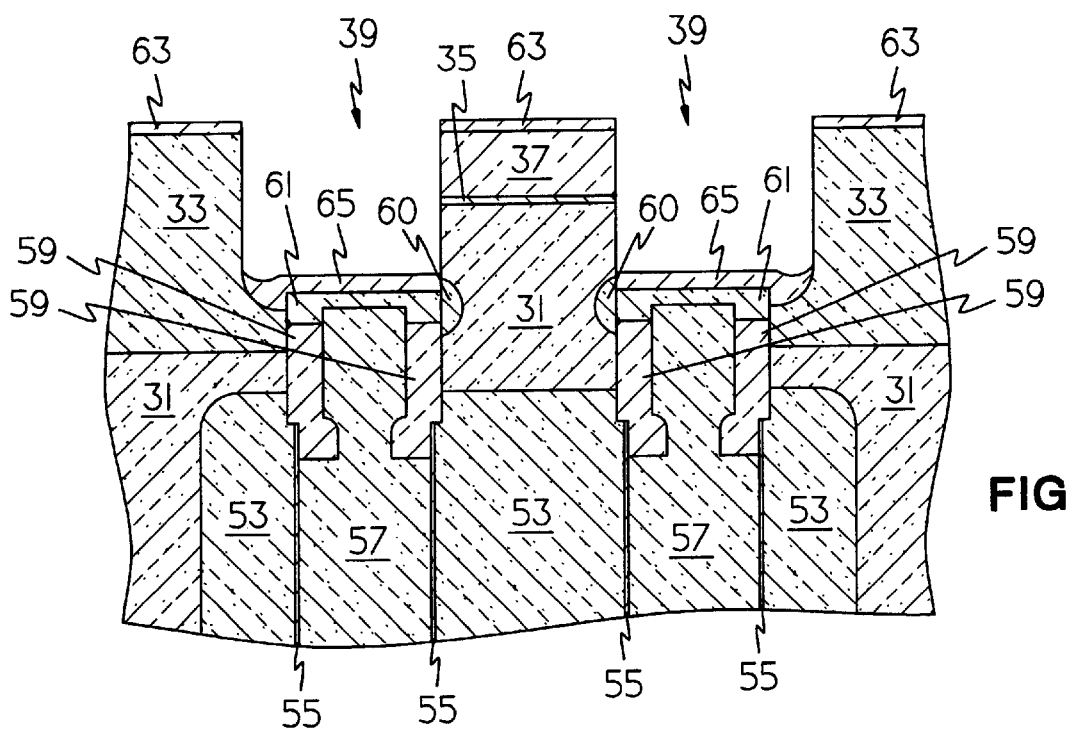
FIG. 8 is a cross-section view of the structure as it would appear after STEP 22 of the process of FIG. 1.

Returning to FIG. 1, the thin silicon nitride layer 45 above the STI regions 33 is removed in STEP 21 and, in STEP 22, high density plasma (HDP) oxide is deposited on the top of the STI regions 33, on the top of the pad nitride layer 37, and at the bottom of the trenches 39. The HDP oxide 65 in the trenches 39 forms insulating layers between the n+ polysilicon conductive caps 61 and the gate of the transfer device which will be formed in a subsequent step. Referring to FIG. 8, which shows the structure after STEP 22 of FIG. 1, HDP oxide layers 63 have been formed on the top surfaces of STI regions 33 and over the nitride layer 37. HDP oxide layers 65 have been formed in the deep trenches 39. The n+ diffusion regions 60 are larger than before.

Figure 9:
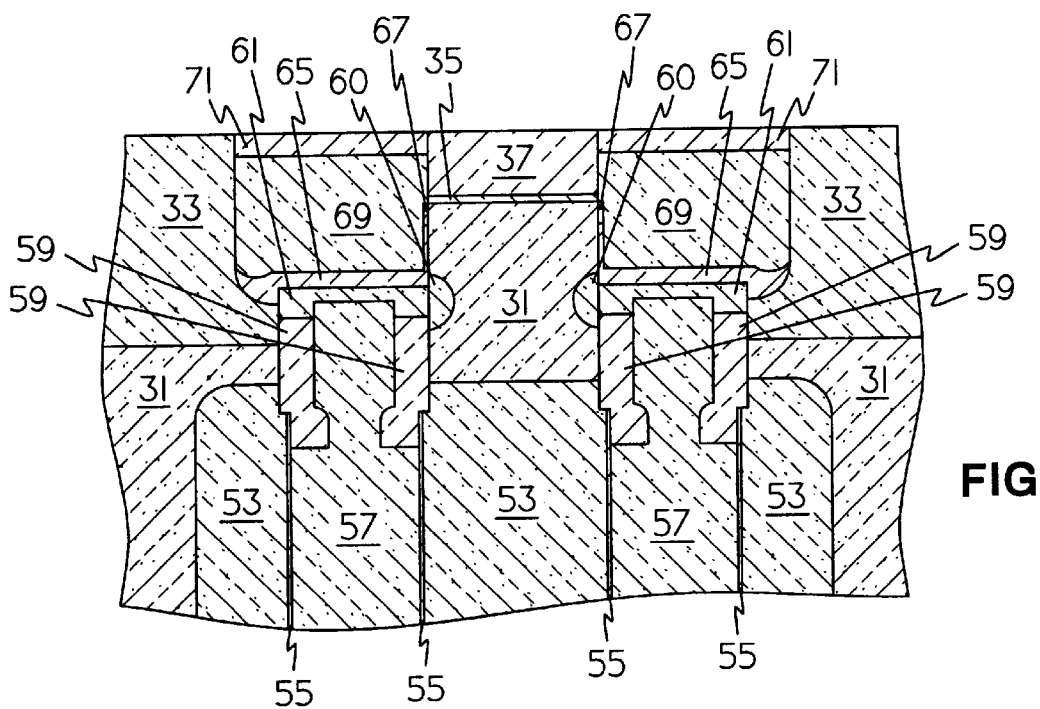
FIG. 9 is a cross-section view of the structure as it would appear after STEP 25 of the process of FIG. 1.

Returning to FIG. 1, a gate dielectric 67 is formed on the exposed silicon sidewalls of the upper portions of the deep trenches 39 in STEP 23. Next, in STEP 24, the recess above HDP oxide layers 65 is filled with n+ polysilicon 69 that is planarized to the top surface of the pad nitride layer 37 and will serve as the gate conductor of the transistor. The n+ polysilicon 69 is slightly recessed and a layer of oxide 71 is deposited in these recesses in STEP 25. Referring to FIG. 9, which shows the structure after STEP 25 of FIG. 1, gate dielectric 67 on the silicon sidewalls of the upper portions of deep trenches 39 and the recesses above HDP oxide layers 65 have been filled with n+ polysilicon 69. Layers of oxide 71 have been formed in the shallow recesses in n+ polysilicon 69. The n+ diffusion regions 60 are even larger than before.

Returning to FIG. 1, in STEP 26, the pad nitride layer 37 and the pad oxide layer 35 above the p-silicon substrate 31 and extending between the STI regions 33 are removed and, in STEP 27, an n+ diffusion region 73 is formed in the upper portion of the p-silicon substrate 31 by ion implantation or another well known process. This n+ diffusion region 73 will serve as either the source or the drain of the transfer device. Then, in STEP 28, a CVD oxide layer 75 is deposited above the n+ diffusion region 73 at the top of the p-silicon substrate 31 and the oxide layer 75 is planarized. In STEP 29, grooves are etched and, in STEP 30, these grooves are filled with conductors 77, 79 that are planarized.

Figure 10:
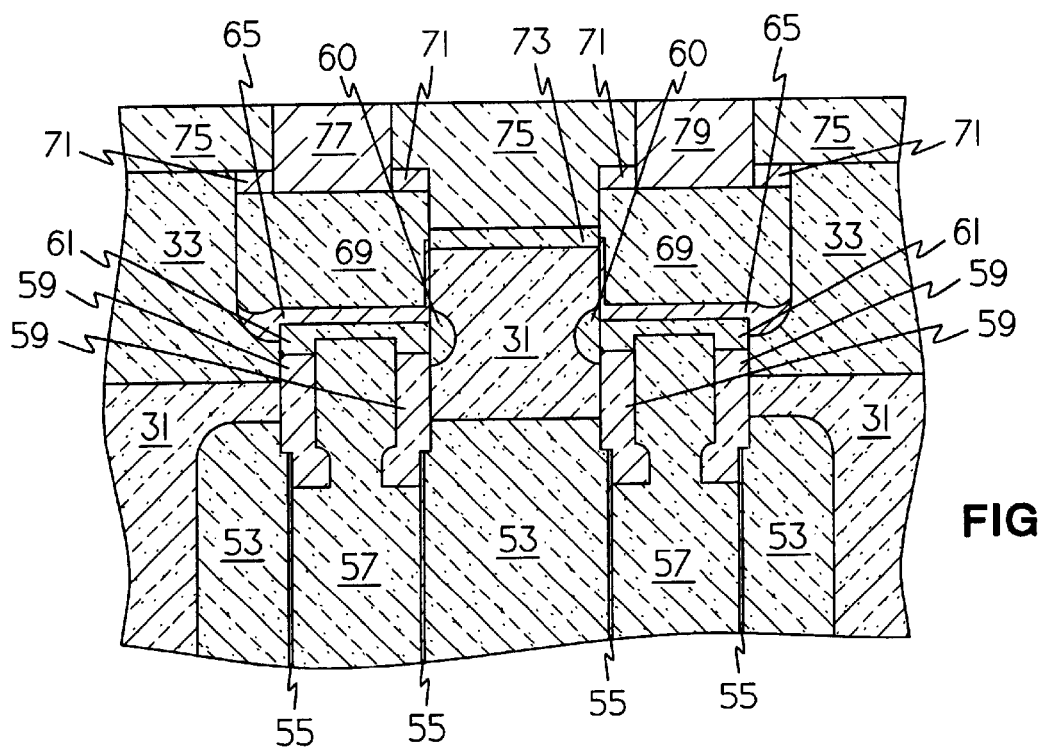
FIG. 10 is a cross-section view of the structure as it would appear after STEP 30 of the process of FIG. 1.

Referring to FIG. 10, which shows the structure after STEP 30 of the process of FIG. 1, n+ diffusion region 73 has been formed in the upper portion of p-silicon substrate 31 at the top of the p-silicon substrate 31 and n+ diffusion regions 60 are larger than before. CVD oxide layer 75 has been deposited above the n+ diffusion region 73. Conductors 77 and 79 fill grooves extending through CVD oxide layer 75 and oxide layers 71. Conductors 77 and 79 serve as wordlines that contact the top surfaces of n+ polysilicon 69 which, as indicated above, serve as gates.

Figure 11:
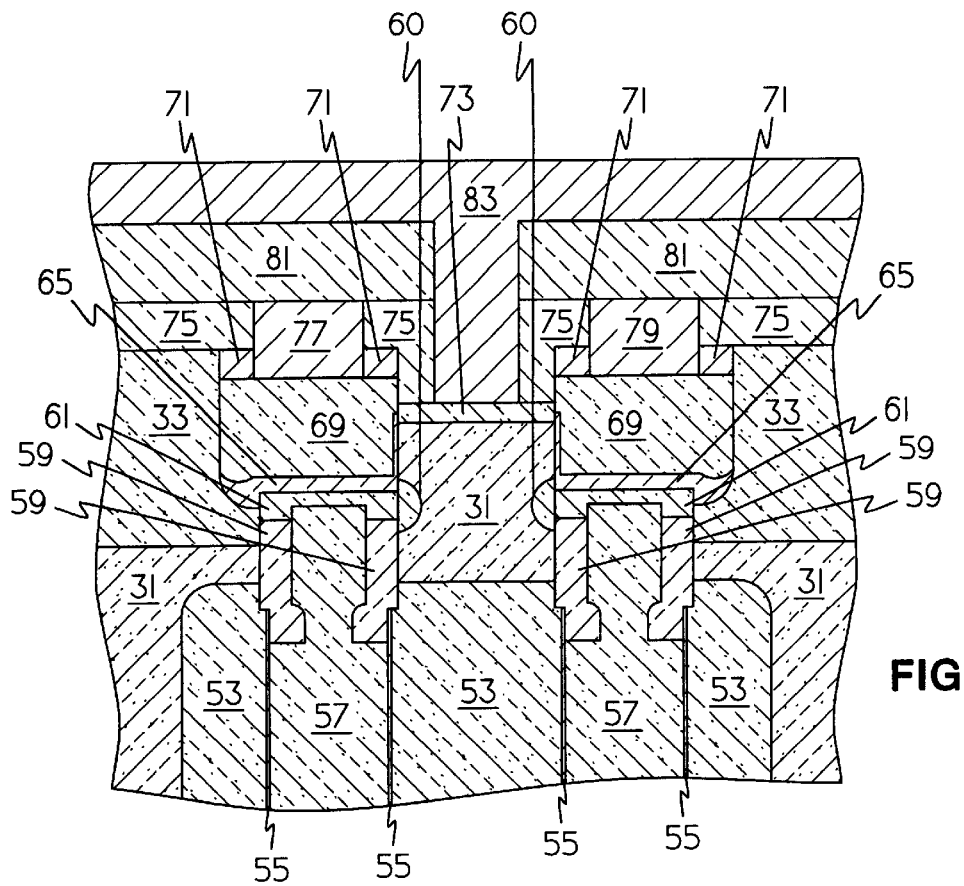
FIG. 11 is a cross-section view of the structure as it would appear after STEP 33 of the process of FIG. 1, namely a dynamic random access memory cell constructed in accordance with the present invention.

Returning to FIG. 1, in STEP 31, CVD oxide 81 is deposited over the conductors 77, 79 and, in STEP 32, an opening to the n+ diffusion region 73 is formed. Then, in STEP 33, tungsten, n+ polysilicon, or another conductive material 83 is deposited over the CVD oxide 81 and in the opening leading to the n+ diffusion region 73. Referring to FIG. 11, which shows the structure after STEP 33 of FIG. 1, CVD oxide 81 extends over conductors 77, 79 and conductive material 83 extends over the CVD oxide 81 and through to n+ diffusion region 73. Conductive material 83 serves as a bitline.

Figure 12:
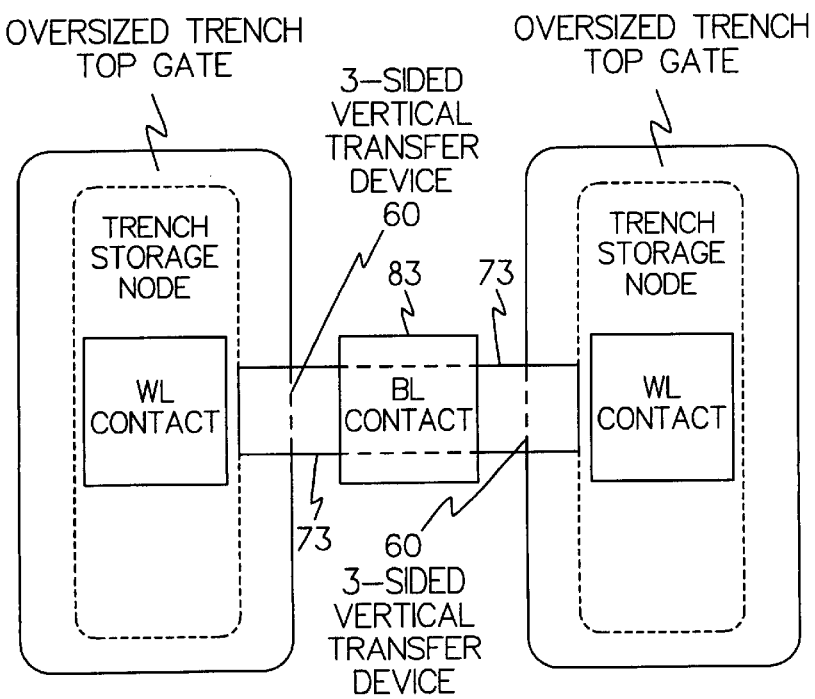
FIG. 12 is a top view of a pair of dynamic random access memory cells constructed in accordance with the present invention.

As shown most clearly in FIG. 12, a pair of dynamic random access memory cells, constructed in accordance with the present invention, has a first end of the active area surrounded by the first gate conductor along first and second opposed (vertical) walls of the first end of the active area and a third (vertical) wall of the first end of the active area extending between the first and the second opposed walls of the first end of the active area and a second end of the active area surrounded by the second gate conductor along first and second opposed walls of the second end of the active area and a third wall of the second end of active area extending between the first and the second opposed walls of the second end of the active area. Preferably, the distance between the first and the second opposed walls of the first end of the active area is less than fifty percent of the width of the first deep trench and the distance between the first and the second opposed walls of the second end of the active area is less than fifty percent of the width of the second deep trench.

The major benefits achieved from dynamic random access memory cells constructed in accordance with the present invention, such as the one illustrated in FIGS. 11 and 12, are: (1) increased on current in the vertical MOSFETs, because the reduced width of the active area produces a volume inversion effect, and in the three-sided gate conductors surrounding the active area; (2) increased length of the channel regions in the active area relative to planar MOSFETs (i.e., the distance between the first and the second diffusion regions and the distance between the first and the third diffusion regions) which improves the threshold voltage tolerance; and (3) flexibility in setting the length of the channel regions in the active areas because the sidewall diffusion regions can be moved up or down to suit a particular application. In addition, because the shapes of the trenches and the active area are made by separate masks, there is a risk of misalignment (i.e., active areas will fall outside the areas of the trenches and vice versa). This misalignment can lead to large variations in electrical characteristics. The risk of misalignment is reduced with dynamic random access memory cells constructed in accordance with the present invention, however, because the width of the active area, relative to the width of the storage trench, is reduced.

Figure 13:
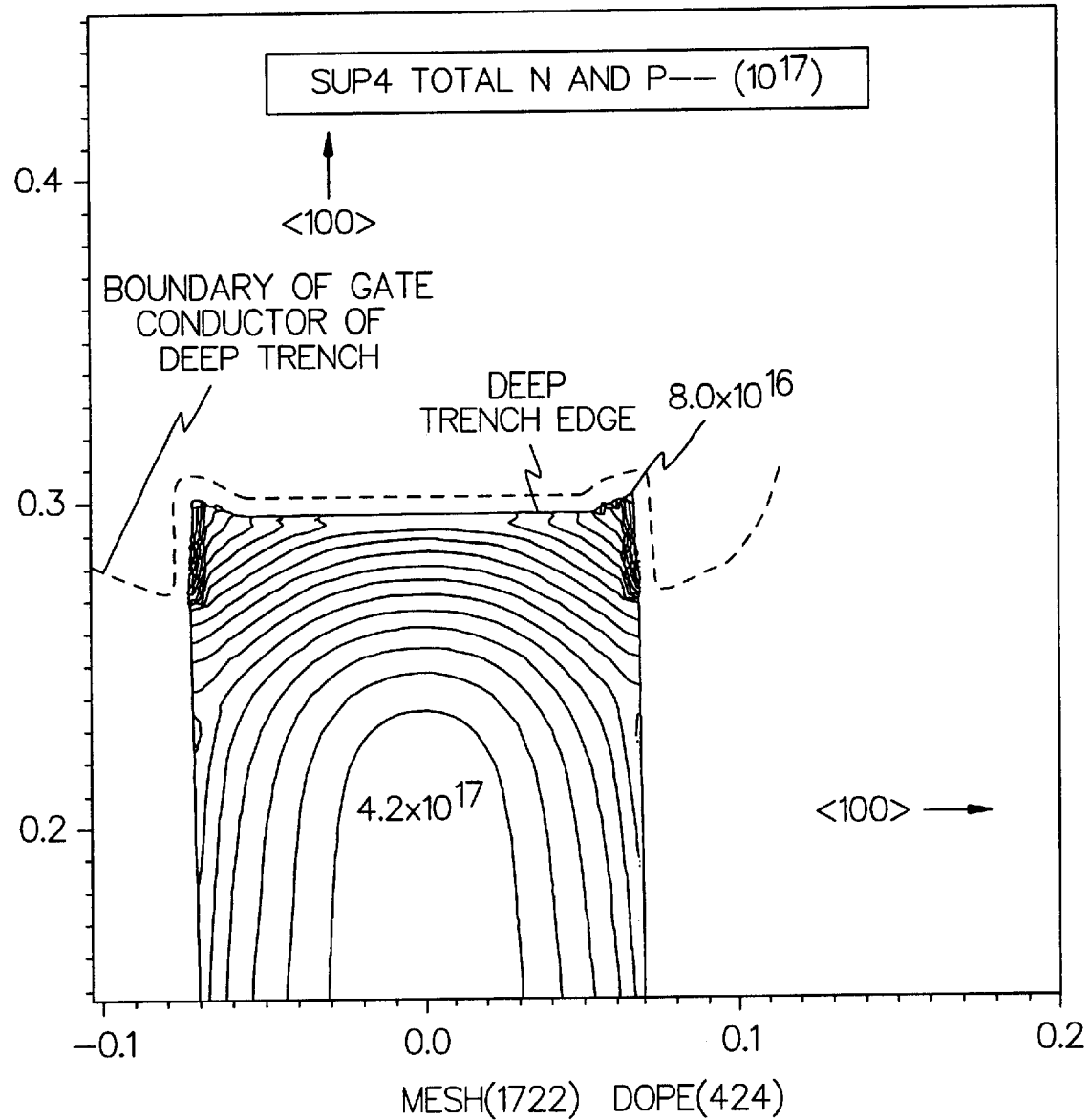
FIG. 13 is a simulation of a DRAM cell that does not incorporate the present invention with perfect alignment of the deep trench and the active area.
Figure 14:
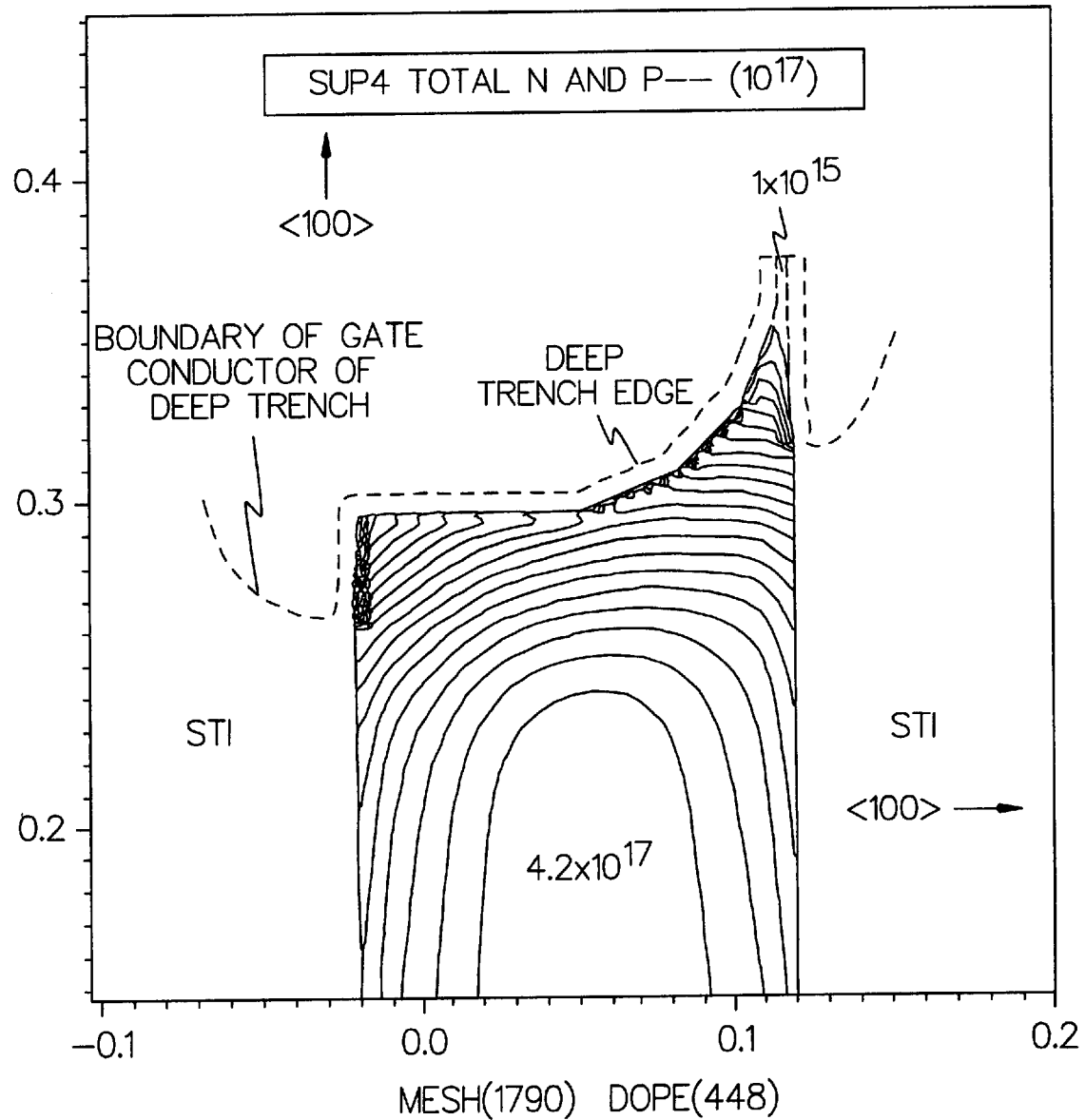
FIG. 14 is a simulation of a DRAM cell that does not incorporate the present invention with the deep trench and the active area misaligned.
Figure 15:
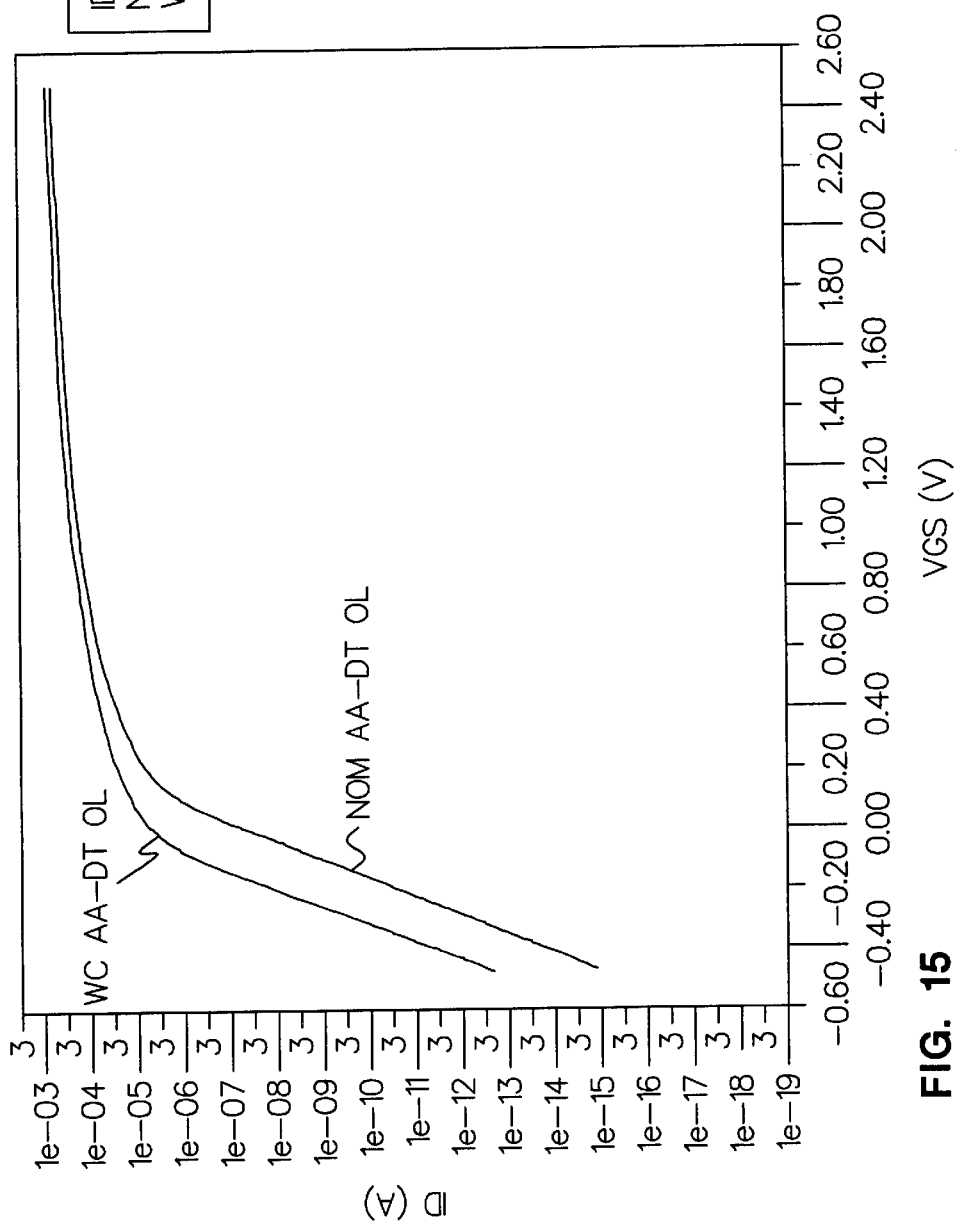
FIG. 15 is a graph that compares the variations in threshold voltage and off-current between a worst case misalignment and nominal alignment of the deep trench and active area of a DRAM cell that does not incorporate the present invention.

FIGS. 13 and 14 are simulations of a DRAM cell that does not incorporate the present invention with perfect alignment of the deep trench and the active area (FIG. 13) and with the deep trench and the active area misaligned (FIG. 14). The contour lines represent contours of doping concentration in a horizontal section taken midway between the source and drain diffusions. FIG. 15 is a graph that compares the variations in threshold voltage and off-current between a worst case misalignment and nominal alignment of the deep trench and active area of a DRAM cell that does not incorporate the present invention.

Figure 16:
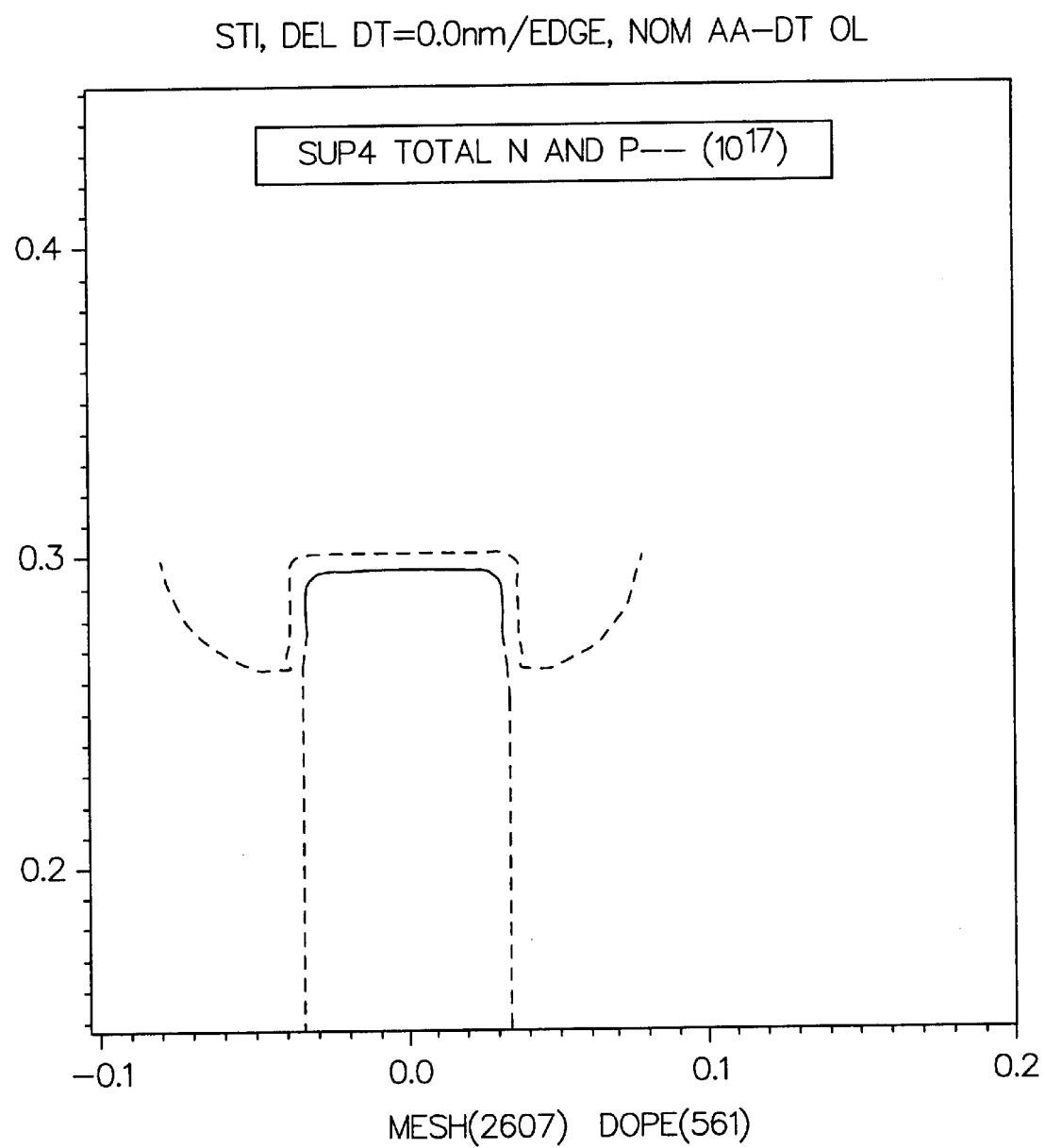
FIG. 16 is a simulation of a DRAM cell that incorporates the present invention with perfect alignment of the deep trench and the active area.
Figure 17:
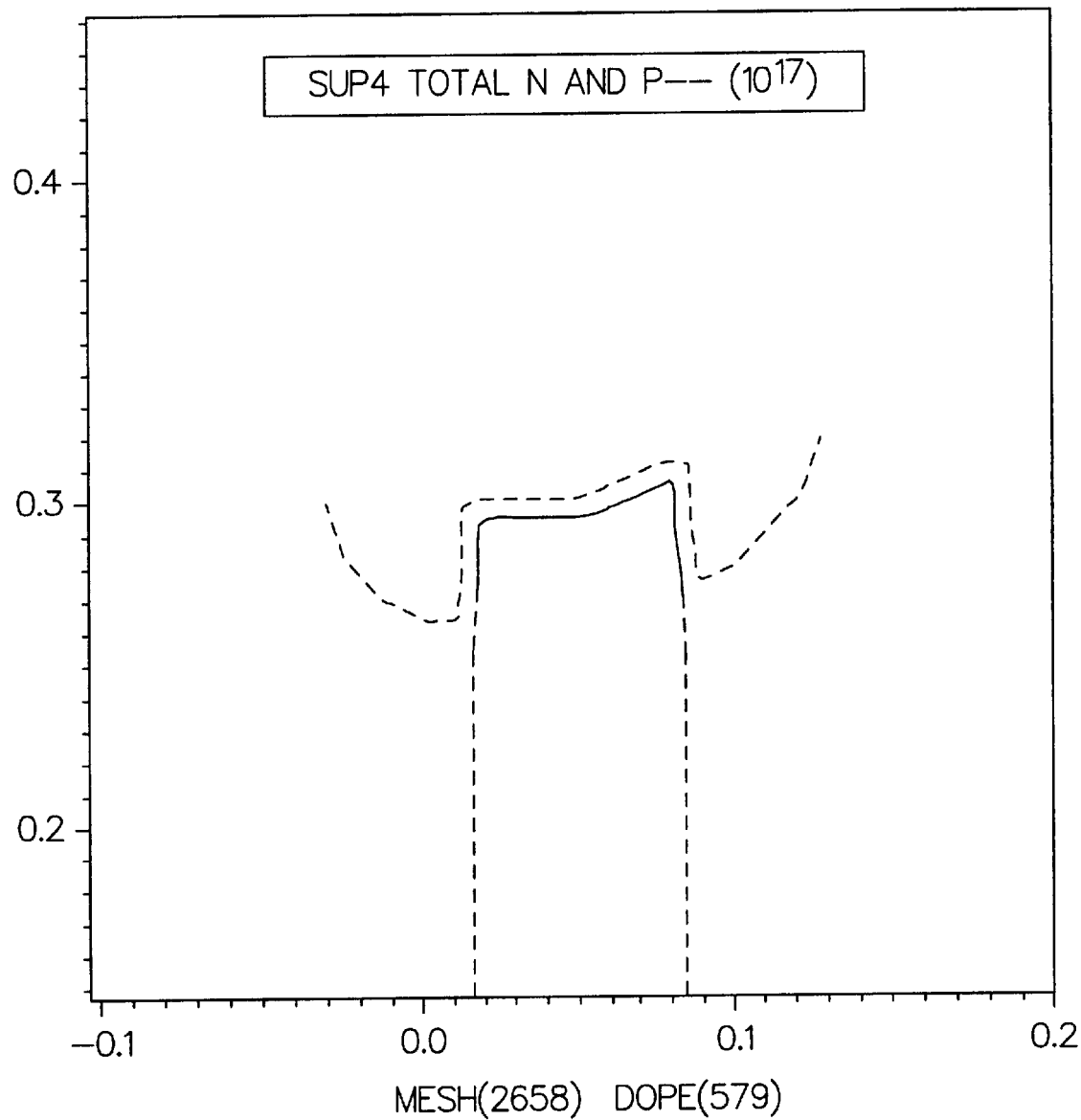
FIG. 17 is a simulation of a DRAM cell that incorporates the present invention with the deep trench and the active area misaligned.
Figure 18:
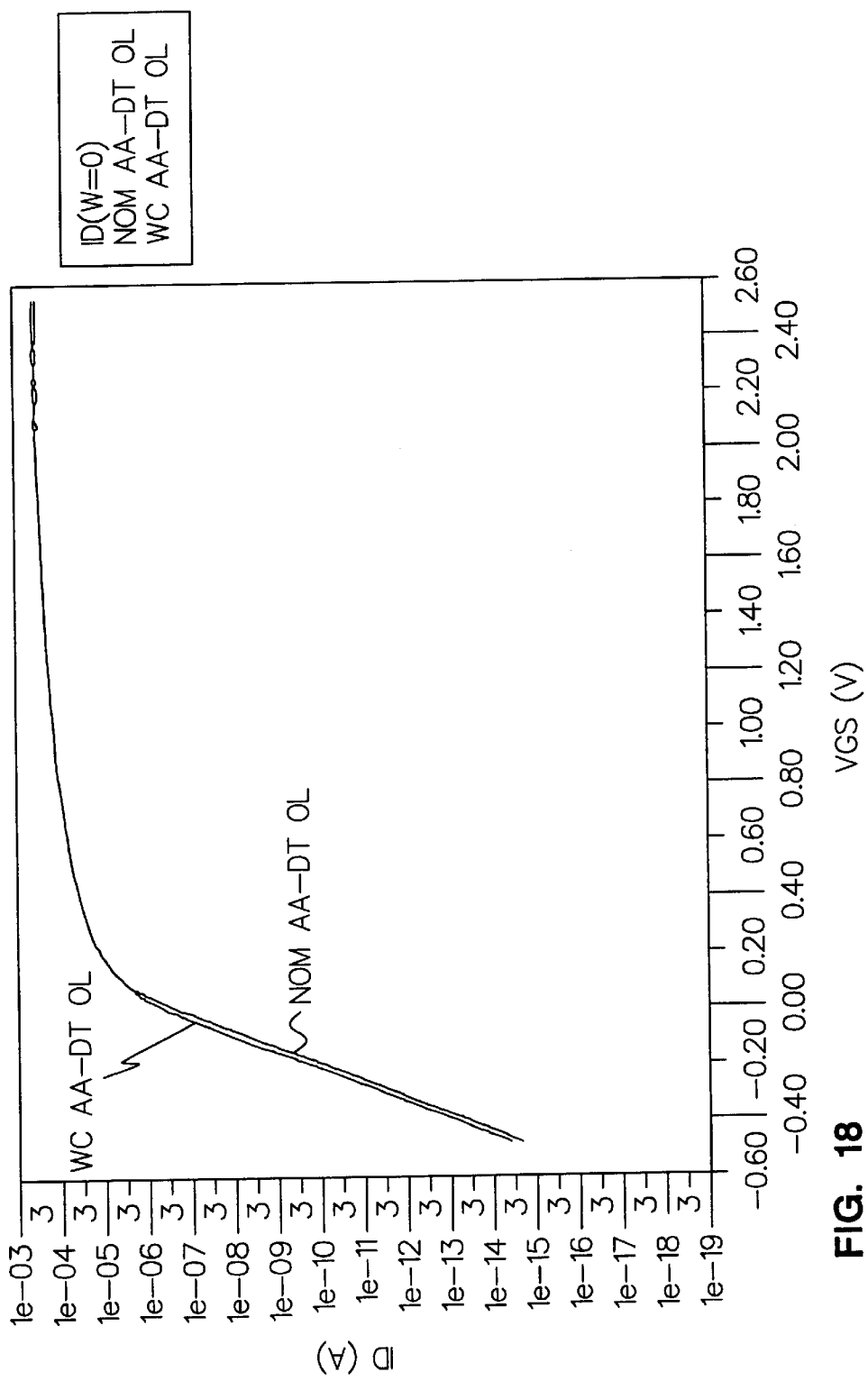
FIG. 18 is a graph that compares the variations in threshold voltage and off-current between a worst case misalignment and nominal alignment of the deep trench and active area of a DRAM cell that incorporates the present invention.

FIGS. 16 and 17 are simulations of a DRAM cell that incorporates the present invention with perfect alignment of the deep trench and the active area (FIG. 16) and with the deep trench and the active area misaligned (FIG. 17). FIG. 18 is a graph that compares the variations in threshold voltage and off-current between a worst case misalignment and nominal alignment of the deep trench and active area of a DRAM cell that incorporates the present invention.

In FIGS. 13 through 18:
"DT" represents "deep trench";
"AA" represents "active area";
"OL" represents "overlay";
"NOM" represents "nominal"; and
"WC" represents "worst case."

A pronounced difference between the simulations shown in FIGS. 13 and 14 is the significant reduction in doping concentration in the upper right-hand corner of the FIG. 14 simulation. This reduction leads, in turn, to a reduction in the threshold voltage and the off-current (i.e., the drain current when the gate voltage is a minimum). For a minimum width AA (i.e., the smallest feature printable using standard lithography processes) of F=0.15 $\mu$m versus a sub-minimum width of F/2=0.075 $\mu$m:

the threshold voltage variation ($V_T$) due to AA-DT overlay tolerance (±50 nm) is:

| Standard AA width (F) | ±180 mV |
| Sub-minimum AA width (F/2) | ±15 mV | the off-current variation ($I_{OFF}$) due to AA-DT overlay tolerance (±50 nm) is:

| Standard AA width (F) | ±200 X |
| Sub-minimum AA width (F/2) | ±2 X |

This is shown most clearly in FIGS. 15 and 18 by the significant reduction in the spacing between the WC curve and the NOM in going from FIG. 15, which represents a DRAM cell which does not incorporate the present invention, to FIG. 18, which represents a DRAM cell which incorporates the present invention.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A vertical FET apparatus comprising:
   a semiconductor substrate;
   first and second first type diffusion regions in the substrate, wherein the first diffusion region is disposed vertically above the second diffusion region and the first and second first type diffusion regions each comprise at least three vertical diffusion sides having a dielectric layer thereon;
   a second type channel region in the substrate between the first and second first type diffusion regions, wherein the second type channel region comprises at least three vertical channel sides having a dielectric layer thereon and each coextensive with one of said at least three vertical diffusion sides; and
   a three sided gate on the dielectric layer adjacent to the three vertical channel sides and the three vertical diffusion sides.

2. The FET apparatus of claim 1 wherein the three vertical channel sides are each substantially coplanar with a corresponding one of the vertical diffusion sides of both the first and second first type diffusion regions.

3. The FET apparatus of claim 1 further comprising a storage node adjacent the second diffusion region for storing a datum appearing on the first diffusion region in response to a store signal on the gate.

4. The FET apparatus of claim 3 further comprising a bitline and a wordline, wherein the storage node comprises a DRAM storage cell, the first diffusion region is coupled to the bitline, and the gate is coupled to the wordline.

5. A pair of dynamic random access memory cells comprising:
   a substrate having:
   (a) first and second deep trenches separated by an active area defined by a first end at a sidewall of the first deep trench and a second end at a sidewall of the second deep trench,
   (b) a first diffusion region:
      (1) in the active area,
      (2) extending between an upper portion of the first deep trench and an upper portion of the second deep trench, and
      (3) connected to a bitline,
   (c) a second diffusion region in the active area and adjacent the sidewall of the first deep trench, whereby a first channel region is created in the active area between the first diffusion region and the second diffusion region, and
   (d) a third diffusion region in the active area and adjacent the sidewall of the second deep trench, whereby a second channel region is created in the active area between the first diffusion region and the third diffusion region;
   first and second storage node electrodes in lower portions of the first deep trench and the second deep trench, respectively;
   first and second storage plates surrounding lower portions of the first deep trench and the second deep trench, respectively;
   first and second dielectric members, respectively, between the first storage node electrode and the first storage plate and between the second storage node electrode and the second storage plate;
   a first gate conductor:
      (a) in the upper portion of the first deep trench,
      (b) surrounding the first end of the active area in the substrate, and
      (c) connected to a first wordline
   for controlling current in the first channel region between the first diffusion region and the second diffusion region;
   a second gate conductor:
      (a) in the upper portion of the second deep trench,
      (b) surrounding the second end of the active area in the substrate, and
      (c) connected to a second wordline for controlling current in the second channel region between the first diffusion region and the third diffusion region;

a first isolation collar on the walls of the upper portion of the first deep trench extending between the first storage plate and the second diffusion region;

a second isolation collar on the walls of the upper portion of the second deep trench extending between the second storage plate and the third diffusion region; and first and second buried straps, respectively, connecting the first storage node electrode with the second diffusion region and the second storage node electrode with the third diffusion region.

6. The pair of dynamic random access memory cells according to claim 5 wherein the substrate is a p-type silicon substrate.

7. The pair of dynamic random access memory cells according to claim 6 wherein the first diffusion region, the second diffusion region, and the third diffusion region are n+ diffusion regions.

8. The pair of dynamic random access memory cells according to claim 7 wherein the first storage plate and the second storage plate are n+ silicon storage plates.

9. The pair of dynamic random access memory cells according to claim 8 wherein the first gate conductor and the second gate conductor are n+ polysilicon gate conductors.

10. The pair of dynamic random access memory cells according to claim 5 wherein:

(a) the first end of the active area is surrounded by the first gate conductor along first and second opposed walls of the first end of the active area and a third wall of the first end of the active area extending between the first and the second opposed walls of the first end of the active area, and (b) the second end of the active area is surrounded by the second gate conductor along first and second opposed walls of the second end of the active area and a third wall of the second end of the active area extending between the first and the second opposed walls of the second end of the active area.

11. The pair of dynamic random access memory cells according to claim 10 wherein:

(a) the distance between the first and the second opposed walls of the first end of the active area is less than fifty percent of the width of the first deep trench, and (b) the distance between the first and the second opposed walls of the second end of the active area is less than fifty percent of the width of the second deep trench.

12. A pair of dynamic random access memory cells comprising:

a substrate having:

(a) first and second deep trenches separated by an active area defined by (1) a first end at a sidewall of the first deep trench, the first end of the active area having first and second opposed walls spaced by a distance which is less than fifty percent of the width of the first deep trench, and (2) a second end at a sidewall of the second deep trench, the second end of the active area having first and second opposed walls spaced by a distance which is less than fifty percent of the width of the second deep trench, (b) a first diffusion region:

(1) in the active area, (2) extending between an upper portion of the first deep trench and an upper portion of the second deep trench, and (3) connected to a bitline, (c) a second diffusion region in the active area and adjacent the sidewall of the first deep trench, whereby a first channel region is created in the active area between the first diffusion region and the second diffusion region, and (d) a third diffusion region in the active area and adjacent the sidewall of the second deep trench, whereby a second channel region is created in the active area between the first diffusion region and the third diffusion region;

first and second storage node electrodes in lower portions of the first deep trench and the second deep trench, respectively;

first and second storage plates surrounding lower portions of the first deep trench and the second deep trench, respectively;

first and second dielectric members, respectively, between the first storage node electrode and the first storage plate and between the second storage node electrode and the second storage plate;

a first gate conductor:

(a) in the upper portion of the first deep trench, (b) surrounding the first end of the active area in the substrate, and (c) connected to a first wordline for controlling current in the first channel region between the first diffusion region and the second diffusion region;

a second gate conductor:

(a) in the upper portion of the second deep trench, (b) surrounding the second end of the active area in the substrate, and (c) connected to a second wordline for controlling current in the second channel region between the first diffusion region and the third diffusion region;

a first isolation collar on the walls of the upper portion of the first deep trench extending between the first storage plate and the second diffusion region;

a second isolation collar on the walls of the upper portion of the second deep trench extending between the second storage plate and the third diffusion region; and first and second buried straps, respectively, connecting the first storage node electrode with the second diffusion region and the second storage node electrode with the third diffusion region.

13. The pair of dynamic random access memory cells according to claim 12 wherein the substrate is a p-type silicon substrate.

14. The pair of dynamic random access memory cells according to claim 13 wherein the first diffusion region, the second diffusion region, and the third diffusion region are n+ diffusion regions.

15. The pair of dynamic random access memory cells according to claim 14 wherein the first storage plate and the second storage plate are n+ silicon storage plates.

16. The pair of dynamic random access memory cells according to claim 15 wherein the first gate conductor and the second gate conductor are n+ polysilicon gate conductors.

17. The pair of dynamic random access memory cells according to claim 12 wherein:

(a) the first end of the active area is surrounded by the first gate conductor along the first and second opposed walls of the first end of the active area and a third wall of the first end of the active area extending between the first and the second opposed walls of the first end of the active area, and (b) the second end of the active area is surrounded by the second gate conductor along the first and second opposed walls of the second end of the active area and a third wall of the second end of the active area extending between the first and the second opposed walls of the second end of the active area.

18. The pair of dynamic random access memory cells according to claim 17 wherein the substrate is a p-type silicon substrate.

19. The pair of dynamic random access memory cells according to claim 18 wherein the first diffusion region, the second diffusion region, and the third diffusion region are n+ diffusion regions.

20. The pair of dynamic random access memory cells according to claim 19 wherein the first storage plate and the second storage plate are n+ silicon storage plates.

* * * * *